US012588440B2

(12) United States Patent (10) Patent No.: US 12,588,440 B2
Igarashi et al. (45) Date of Patent: Mar. 24, 2026

(54) SUBSTRATE PROCESSING METHOD AND SUBSTRATE PROCESSING APPARATUS FOR ETCHING USING OXIDIZATION

(71) Applicant: Tokyo Electron Limited, Tokyo (JP)

(72) Inventors: Kazumasa Igarashi, Yamanashi (JP);
Yamato Tonegawa, Yamanashi (JP);
Jun Ogawa, Yamanashi (JP); Yuki Tanaka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 318 days.

(21) Appl. No.: 18/316,692

(22) Filed: May 12, 2023

(65) Prior Publication Data

US 2023/0395368 A1     Dec. 7, 2023

(30) Foreign Application Priority Data

Jun. 7, 2022     (JP) .................................. 2022-091976

(51) Int. Cl.
H01L 21/02          (2006.01)
H01L 21/311         (2006.01)

(52) U.S. Cl.
CPC .... H01L 21/0214 (2013.01); H01L 21/02233 (2013.01); H01L 21/31116 (2013.01)

(58) Field of Classification Search
CPC . H01L 51/5056; H01L 51/5088; H01L 51/56; H01L 51/5004; H01L 2251/55; H01L 2251/558; H01L 51/5253; H01L 51/5225; H01L 51/5209; H01L 51/5203; H01L 51/0023; H01L 51/0017; H01L 51/0011; H01L 51/0014; H01L 27/3216; H01L 27/3218; H01L 21/0214; H01L 21/02233; H01L 21/31116; H01L 21/02326; H10K 50/822; H10K 50/813; H10K 50/844; H10K 71/00; H10K 71/231; H10K 71/621; H10K 71/166; H10K 59/352; H10K 59/353; H10K 50/805; H10K 71/20; H10K 2102/351; H10K 59/1201; H10K 59/35; H10K 59/38; H10K 59/80518; H10K 71/233; H10K 50/11; H10K 59/8051; H10K 59/8052; H10K 59/875; H10K 71/12; H10K 71/60; C23C 14/042; C23C 14/24; G09F 9/00; G09F 9/30; H05B 33/04;

(Continued)

(56) References Cited

U.S. PATENT DOCUMENTS 5,716,495 A * 2/1998 Butterbaugh ....... C23C 16/0236
257/E21.258
5,858,878 A * 1/1999 Toda ................. H01L 21/30604
438/723

(Continued)

FOREIGN PATENT DOCUMENTS

JP       2004-343094       12/2004
JP       2009-152550       7/2009

(Continued)

*Primary Examiner* — Caleb E Henry
(74) *Attorney, Agent, or Firm* — IPUSA, PLLC

(57)          ABSTRACT

A substrate processing method includes preparing a substrate having a target film including silicon, carbon, and nitrogen on a surface of the substrate; supplying hydrogen gas and oxygen gas to the target film to oxidize a surface layer of the target film and form an oxide film; and etching the oxide film.

7 Claims, 5 Drawing Sheets

(58) Field of Classification Search
CPC ........ H05B 33/10; H05B 33/24; H05B 33/26;
H01J 37/32449
See application file for complete search history.

(56) References Cited

U.S. PATENT DOCUMENTS

| | | | | |
|---|---|---|---|---|
| 7,164,151 | B2* | 1/2007 | Yamazaki | H10K 50/15 |
| | | | | 257/E27.111 |
| 9,412,587 | B2* | 8/2016 | Moriya | C23C 16/45544 |
| 10,770,336 | B2* | 9/2020 | Hill | C30B 25/08 |
| 2002/0072139 | A1* | 6/2002 | Kashiwabara | H10K 59/00 |
| | | | | 438/29 |
| 2004/0056590 | A1* | 3/2004 | Lim | H10K 50/852 |
| | | | | 313/506 |
| 2012/0276484 | A1* | 11/2012 | Izumi | H10K 71/164 |
| | | | | 216/13 |
| 2013/0056719 | A1* | 3/2013 | Komatsu | H10K 50/17 |
| | | | | 438/34 |
| 2013/0102132 | A1* | 4/2013 | Takeda | C23C 16/4408 |
| | | | | 118/706 |
| 2013/0126840 | A1* | 5/2013 | Fujimura | H05B 33/22 |
| | | | | 438/46 |
| 2013/0126842 | A1* | 5/2013 | Takeuchi | H10K 50/17 |
| | | | | 438/30 |
| 2013/0134474 | A1* | 5/2013 | Takeuchi | H10H 20/833 |
| | | | | 438/22 |
| 2013/0137205 | A1* | 5/2013 | Moriyama | H10K 71/10 |
| | | | | 438/46 |
| 2014/0004640 | A1* | 1/2014 | Hamaguchi | H10K 71/40 |
| | | | | 438/34 |
| 2014/0004642 | A1* | 1/2014 | Otsuka | H10K 59/35 |
| | | | | 438/46 |
| 2015/0076476 | A1* | 3/2015 | Odaka | H10K 59/124 |
| | | | | 438/33 |
| 2015/0364716 | A1* | 12/2015 | Shiobara | H10K 59/8051 |
| | | | | 345/204 |
| 2016/0141173 | A1* | 5/2016 | Moriya | H01L 21/02576 |
| | | | | 438/479 |
| 2017/0309833 | A1* | 10/2017 | Lei | H10K 50/17 |
| 2018/0166303 | A1* | 6/2018 | Tabata | H01J 37/32137 |
| 2018/0226024 | A1* | 8/2018 | Tang | H10K 50/814 |
| 2018/0269421 | A1* | 9/2018 | Pan | H10K 50/818 |
| 2019/0081116 | A1* | 3/2019 | Kondo | H10K 59/35 |
| 2019/0081239 | A1* | 3/2019 | Fukagawa | H10K 50/81 |
| 2019/0267438 | A1* | 8/2019 | Goto | H10K 71/00 |
| 2020/0013977 | A1* | 1/2020 | Wang | H10H 29/10 |
| 2020/0161594 | A1* | 5/2020 | Kondo | H10K 71/135 |
| 2020/0203662 | A1* | 6/2020 | Mollard | H10K 59/876 |
| 2020/0279897 | A1* | 9/2020 | Nendai | H10K 59/131 |
| 2020/0283894 | A1* | 9/2020 | Lehn | C23C 16/45534 |
| 2020/0312681 | A1* | 10/2020 | Tanaka | H01L 21/67069 |
| 2020/0385861 | A1* | 12/2020 | Deye | C23C 16/4405 |
| 2020/0385868 | A1* | 12/2020 | Kim | H01L 21/67242 |
| 2020/0395199 | A1* | 12/2020 | Miyama | C23C 16/4405 |
| 2020/0395209 | A1* | 12/2020 | Yoshimoto | H01L 21/0234 |
| 2020/0395444 | A1* | 12/2020 | Lo | C30B 29/10 |
| 2021/0002762 | A1* | 1/2021 | Jun | C23C 16/52 |
| 2021/0159077 | A1* | 5/2021 | Longrie | H01L 21/76834 |
| 2021/0272803 | A1* | 9/2021 | Nakatani | H01L 21/32 |

FOREIGN PATENT DOCUMENTS

| | | |
|---|---|---|
| JP | 2019-125714 | 7/2019 |
| JP | 2022-018973 | 1/2022 |

* cited by examiner

FIG.5

SUBSTRATE PROCESSING METHOD AND SUBSTRATE PROCESSING APPARATUS FOR ETCHING USING OXIDIZATION

CROSS-REFERENCE TO RELATED APPLICATION

The present application is based upon and claims priority to Japanese Patent Application No. 2022-091976, filed on Jun. 7, 2022, the entire contents of which are incorporated herein by reference.

TECHNICAL FIELD

The present disclosure relates to a substrate processing method and a substrate processing apparatus.

BACKGROUND

A technique for etching a silicon nitride film by a chemical oxide removal process is known (see, e.g., Patent Document 1.).

Patent Document 1: Japanese Unexamined Patent Application Publication No. 2004-343094

SUMMARY

In view of the above, an aspect of the present disclosure relates to a technology that can control the amount of etching of a target film.

According to one aspect of the present invention, there is provided a substrate processing method including preparing a substrate having a target film including silicon, carbon, and nitrogen on a surface of the substrate; supplying hydrogen gas and oxygen gas to the target film to oxidize a surface layer of the target film and form an oxide film; and etching the oxide film.

BRIEF DESCRIPTION OF THE DRAWINGS

FIG. 5 illustrates the results of evaluating the amount of etching.

DETAILED DESCRIPTION

A non-limiting illustrative embodiment of the present disclosure is described below with reference to the accompanying drawings. In all the accompanying drawings, the same or corresponding members or components are denoted with the same or corresponding reference symbols, and duplicate descriptions are omitted.

(Substrate Processing Method)

Figure 1:
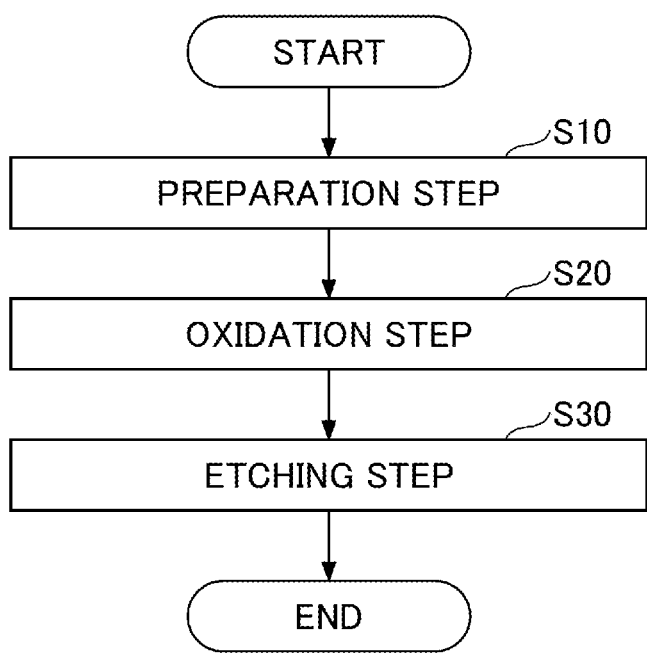
FIG. 1 is a flowchart illustrating the substrate processing method according to an embodiment.

The substrate processing method according to the embodiment will be described with reference to FIGS. 1 to 3. As illustrated in FIG. 1, the substrate processing method according to the embodiment includes a preparation step S10, an oxidation step S20, and an etching step S30.

Figure 2A:
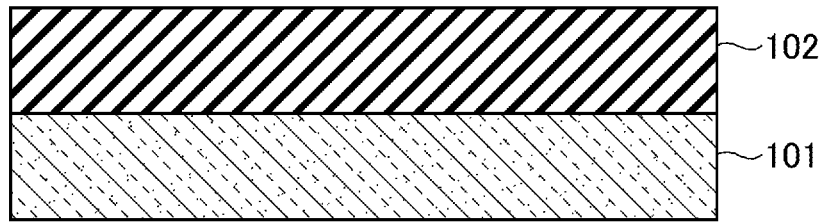
FIGS. 2A to 2C are cross-sectional views illustrating the substrate processing method according to the embodiment.

In the preparation step S10, a substrate 101 having a target film 102 on the surface of the substrate 101 is prepared as illustrated in FIG. 2A. The substrate 101 may be, for example, a silicon wafer. The target film 102 may be, for example, a film including silicon (Si), carbon (C), and nitrogen (N). The target film 102 may be, for example, a SiCN film. The target film 102 may further include elements different from, for example, silicon, carbon and nitrogen. The different elements may be, for example, oxygen (O), boron (B), or a combination thereof.

Figure 2B:
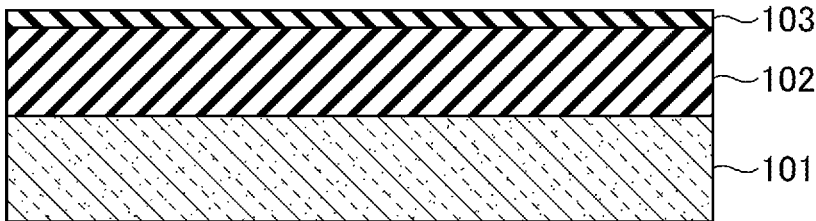

The oxidation step S20 is performed after the preparation step S10. In the oxidation step S20, as illustrated in FIG. 2B, the surface layer of the target film 102 is oxidized to form an oxide film 103. For example, as illustrated in FIG. 3, the oxidation step S20 includes supplying hydrogen gas and oxygen gas to the target film 102 while maintaining the temperature of the substrate 101 at the first temperature T1, and oxidizing the surface layer of the target film 102 to form the oxide film 103. The first temperature T1 may be, for example, greater than or equal to 700 degrees Celsius and less than or equal to 800 degrees Celsius. The oxidation step S20 may include supplying inert gas at the same time as hydrogen gas and oxygen gas.

Figure 2C:
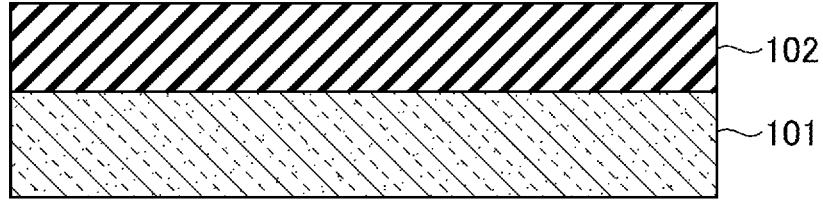

The etching step S30 is performed after the oxidation step S20. In the etching step S30, the oxide film 103 is selectively etched as illustrated in FIG. 2C. The etching step S30 includes a temperature lowering step S31, a COR step S32, a temperature raising step S33, and a PHT step S34 as illustrated in FIG. 3, for example.

Figure 3:
FIG. 3 is a time chart illustrating the substrate processing method according to the embodiment.

The temperature lowering step S31 includes lowering the temperature of the substrate 101 from the first temperature T1 to the second temperature T2 as illustrated in FIG. 3. The second temperature T2 may be lower than, for example, the first temperature T1. The second temperature T2 may be, for example, greater than or equal to 50 degrees Celsius and less than or equal to 100 degrees Celsius.

The COR step S32 is performed after the temperature of the substrate 101 is stabilized to the second temperature T2 in the temperature lowering step S31. The COR step S32 involves converting at least a part of the target film 102 including the surface layer, into a reaction product by chemical oxide removal (COR), which involves etching chemically without generating plasma. The COR step S32 may include, for example, maintaining the temperature of the substrate 101 at a second temperature T2. The COR step S32 includes, for example, as illustrated in FIG. 3, supplying fluorine-containing gas and basic gas to the target film 102 and causing the fluorine-containing gas and basic gas to react with the oxide film 103 to form ammonium silicofluoride $[(NH_4)_2SiF_6]$. The fluorine-containing gas may be, for example, hydrogen fluoride (HF) gas. The basic gas may be, for example, ammonia ($NH_3$) gas. The COR step S32 may include supplying an inert gas at the same time as supplying the fluorine-containing gas and the basic gas.

The temperature raising step S33 is performed after the COR step S32. The temperature raising step S33 includes raising the temperature of the substrate 101 from the second temperature T2 to the third temperature T3. The third temperature T3 may be, for example, lower than the first temperature T1 and higher than the second temperature T2. The third temperature T3 may be higher than the first temperature T1. The third temperature T3 may be, for example, greater than or equal to 300 degrees Celsius.

The PHT step S34 is performed after the temperature raising step S33. The PHT step S34 involves sublimating a reaction product, e.g., ammonium silicofluoride, by a PHT (post heat treatment) that heats the substrate 101 while maintaining the temperature of the substrate 101 at a third temperature T3, as illustrated, for example, in FIG. 3.

When the etching step S30 includes the COR step S32 and the PHT step S34, the target film 102 can be left and the oxide film 103 can be selectively etched and removed. Therefore, the amount of etching of the target film 102 can be controlled by adjusting the thickness of the oxide film 103 formed on the surface layer of the target film 102 in the oxidation step S20. The thickness of the oxide film 103 can be adjusted, for example, by controlling the time for supplying hydrogen gas and oxygen gas to the target film 102 in the oxidation step S20. The thickness of the oxide film 103 can be adjusted, for example, by controlling the first temperature T1 in the oxidation step S20.

The etching step S30 may be performed in the same processing container as that in the oxidation step S20, for example. In this case, the target film can be etched in one processing container. The etching step S30 may be performed, for example, in a processing container different from that in the oxidation step S20. In this case, the temperature lowering step S31 and the temperature raising step S33 can be omitted.

The etching step S30 may be performed, for example, in a processing container housing a plurality of the substrates 101 in a shape of a shelf. In this case, the target film 102 can be etched on a plurality of substrates 101 at one time. This improves productivity.

[Substrate Processing Apparatus]

Figure 4:
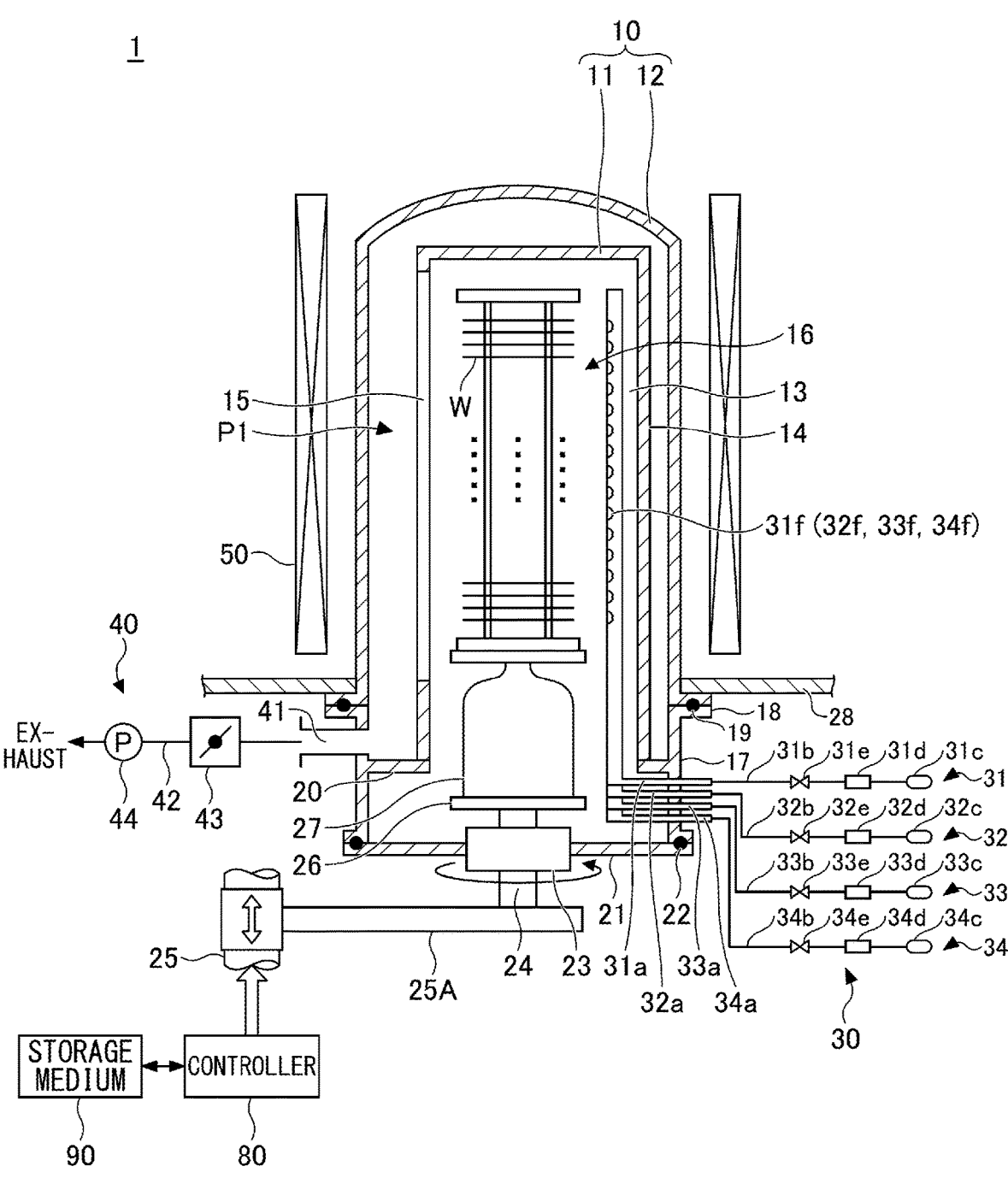
FIG. 4 is a schematic diagram illustrating a substrate processing apparatus according to the embodiment.

A substrate processing apparatus 1 according to the embodiment will be described with reference to FIG. 4. As illustrated in FIG. 4, the substrate processing apparatus 1 is a batch-type apparatus that processes multiple substrates W at once.

The substrate processing apparatus 1 is equipped with a processing container 10, a gas supply 30, an exhauster 40, a heater 50, and a controller 80.

The processing container 10 can be decompressed inside and houses the substrate W. The processing container 10 has an inner pipe 11 having a cylindrical shape with a ceiling and an open lower end, and an outer pipe 12 having a cylindrical shape with a ceiling that covers the outside of the inner pipe 11 and that has an open lower end. The inner pipe 11 and the outer pipe 12 are formed of a heat-resistant material such as quartz. The inner pipe 11 and the outer pipe 12 have a double tube structure arranged coaxially.

The ceiling of the inner pipe 11 may be flat, for example. On one side of the inner pipe 11, a housing part 13 is formed to house the gas nozzles along the longitudinal direction (vertical direction) thereof. For example, a part of the side wall of the inner pipe 11 is protruded outward to form a protruding part 14, and the inside of the protruding part 14 is formed as a housing part 13.

On the side wall on the opposite side of the inner pipe 11 facing the housing part 13, a rectangular opening 15 is formed along the longitudinal direction (vertical direction) thereof.

The opening 15 is a gas exhaust port formed so as to exhaust the gas in the inner pipe 11. The length of the opening 15 is the same as the length of a boat 16 or is formed so as to extend in the vertical direction longer than the length of the boat 16.

The lower end of the processing container 10 is supported by a cylindrical manifold 17. The manifold 17 is formed of, for example, stainless steel. A flange 18 is formed at the upper end of the manifold 17. The flange 18 supports the lower end of the outer pipe 12. A seal member 19 such as an O-ring is provided between the flange 18 and the lower end of the outer pipe 12. With this, the inside of the outer pipe 12 is maintained airtight.

An annular support part 20 is provided on the upper inner wall of the manifold 17. The support part 20 supports the lower end of the inner pipe 11. At the opening of the lower end of the manifold 17, a lid 21 is hermetically attached through a seal member 22 such as an O-ring. With this, the opening at the lower end of the processing container 10, i.e., the opening of the manifold 17, is hermetically sealed. The lid 21 is formed of, for example, stainless steel.

A rotating shaft 24 is provided penetrating at the center of the lid 21 via a magnetic fluid seal 23. The lower part of the rotating shaft 24 is rotatably supported by an arm 25A of an elevating mechanism 25 formed by a boat elevator.

A rotating plate 26 is provided at the upper end of the rotating shaft 24. On the rotating plate 26, the boat 16 holding the substrates W is mounted via a heat retaining platform 27 made of quartz. The boat 16 is rotated by rotating the rotating shaft 24. The boat 16 is moved up and down integrally with the lid 21 by raising and lowering the elevating mechanism 25. Thus, the boat 16 is inserted into and removed out from the processing container 10. The boat 16 can be accommodated in the processing container 10. The boat 16 holds a plurality of (e.g., 50 to 150) substrates W approximately horizontally with vertical spacings.

The gas supply 30 is configured so that various kinds of processing gases used in the substrate processing method described above can be introduced into the inner pipe 11. The gas supply 30 includes a hydrogen supply 31, an oxygen supply 32, a hydrogen fluoride supply 33, and an ammonia supply 34.

The hydrogen supply 31 includes a hydrogen supply pipe 31a in the processing container 10 and a hydrogen supply path 31b outside the processing container 10. The hydrogen supply path 31b is provided with a hydrogen source 31c, a mass flow controller 31d, and a valve 31e in the stated order from the upstream side to the downstream side in the gas flow direction. With this, the hydrogen gas in the hydrogen source 31c is supplied at a controlled timing by the valve 31e, and is adjusted to a predetermined flow rate by the mass flow controller 31d. Hydrogen gas flows from the hydrogen supply path 31b into the hydrogen supply pipe 31a and is discharged from the hydrogen supply pipe 31a into the processing container 10.

The oxygen supply 32 has an oxygen supply pipe 32a in the processing container 10 and an oxygen supply path 32b outside the processing container 10. The oxygen supply path 32b is provided with an oxygen source 32c, a mass flow controller 32d, and a valve 32e in the stated order from the upstream side to the downstream side in the gas flow direction.

Accordingly, the oxygen gas in the oxygen source 32c is supplied at a controlled timing by the valve 32e, and is adjusted to a predetermined flow rate by the mass flow controller 32d. The oxygen gas flows from the oxygen supply path 32b into the oxygen supply pipe 32a, and is discharged from the oxygen supply pipe 32a into the processing container 10.

The hydrogen fluoride supply 33 is equipped with a hydrogen fluoride supply pipe 33a in the processing container 10 and a hydrogen fluoride supply path 33b outside the processing container 10. The hydrogen fluoride supply path 33b is provided with a hydrogen fluoride source 33c, a mass flow controller 33d, and a valve 33e in the stated order from the upstream side to the downstream side in the gas flow direction. As a result, the hydrogen fluoride gas in the hydrogen fluoride source 33c is supplied at a controlled timing by the valve 33e, and is adjusted to a predetermined flow rate by the mass flow controller 33d. The hydrogen fluoride gas flows from the hydrogen fluoride supply path 33b into the hydrogen fluoride supply pipe 33a and is discharged from the hydrogen fluoride supply pipe 33a into the processing container 10. Hydrogen fluoride gas is an example of fluorine-containing gas.

The ammonia supply 34 is equipped with an ammonia supply pipe 34a inside the processing container 10 and an ammonia supply path 34b outside the processing container 10. The ammonia supply path 34b is provided with an ammonia source 34c, a mass flow controller 34d, and a valve 34e in the stated order from the upstream side to the downstream side in the gas flow direction. As a result, the ammonia gas in the ammonia source 34c is supplied at a controlled timing by the valve 34e and adjusted to a predetermined flow rate by the mass flow controller 34d. The ammonia gas flows from the ammonia supply path 34b into the ammonia supply pipe 34a and is discharged from the ammonia supply pipe 34a into the processing container 10. The ammonia gas is an example of a basic gas.

Each gas supply pipe (the hydrogen supply pipe 31a, the oxygen supply pipe 32a, the hydrogen fluoride supply pipe 33a, and the ammonia supply pipe 34a) is fixed to the manifold 17. Each gas supply pipe is formed of, for example, quartz. Each gas supply pipe penetrates the manifold 17 by extending the position near the inner pipe 11 in a straight line along the vertical direction and by bending in an L-shape and extending in the horizontal direction in the manifold 17. Each gas supply pipe is provided side by side along the circumferential direction of the inner pipe 11 and is formed at the same height as each other.

At the portion of the hydrogen supply pipe 31a located within the inner pipe 11, a plurality of hydrogen discharge ports 31f are provided. At the portion of the oxygen supply pipe 32a located within the inner pipe 11, a plurality of oxygen discharge ports 32f are provided. At the portion of the hydrogen fluoride supply pipe 33a located within the inner pipe 11, a plurality of hydrogen fluoride discharge ports 33f are provided. At the portion of the ammonia supply pipe 34a located within the inner pipe 11, a plurality of ammonia discharge ports 34f are provided.

Each discharge port (the hydrogen discharge port 31f, the oxygen discharge port 32f, the hydrogen fluoride discharge port 33f, the ammonia discharge port 34f) is formed at a predetermined interval along the extending direction of each gas supply pipe. Each discharge port releases gas in a horizontal direction. The spacing between each discharge port is set to be the same as the spacing between the substrates W held by the boat 16, for example. The position of each discharge port in the height direction is set to an intermediate position between the substrates W adjacent in the vertical direction. Thus, each discharge port can efficiently supply gas to the opposing surface between the adjacent substrates W.

The gas supply 30 may mix several kinds of gas and discharge the mixed gas from one supply pipe. Each gas supply pipe (the hydrogen supply pipe 31a, the oxygen supply pipe 32a, the hydrogen fluoride supply pipe 33a, and the ammonia supply pipe 34a) may have a different shape or arrangement from each other. Further, the substrate processing apparatus 1 may further include a supply pipe for supplying another kind of gas other than hydrogen gas, oxygen gas, hydrogen fluoride, and ammonia gas.

The exhauster 40 exhausts gas discharged from inside the inner pipe 11 through the opening 15 and discharged from the gas outlet 41 through the space P1 between the inner pipe 11 and the outer pipe 12. The gas outlet 41 is the upper side wall of the manifold 17 and is formed above the support part 20. An exhaust passage 42 is connected to the gas outlet 41. A pressure regulating valve 43 and a vacuum pump 44 are sequentially interposed in the exhaust passage 42 to exhaust the inside of the processing container 10.

The heater 50 is provided around the outer pipe 12. The heater 50 is provided, for example, on a base plate 28. The heater 50 has a cylindrical shape to cover the outer pipe 12. The heater 50 includes a heating element, for example, and heats the substrate W in the processing container 10.

The controller 80 controls the operation of each unit of the substrate processing apparatus 1. The controller 80 may be, for example, a computer. The program of the computer for operating each part of the substrate processing apparatus 1 is stored in a storage medium 90. The storage medium 90 may be, for example, a flexible disk, a compact disk, a hard disk, a flash memory, a DVD, etc.

(Operation of the Substrate Processing Apparatus)

The operation of the substrate processing apparatus 1 when the substrate processing method according to the embodiment is performed is described.

First, the controller 80 controls the elevating mechanism 25 to carry the boat 16 holding the multiple substrates W into the processing container 10, and the opening of the lower end of the processing container 10 is hermetically closed and sealed by the lid 21. Each substrate W is the substrate 101 having the target film 102 on the surface thereof.

Subsequently, the controller 80 controls the gas supply 30, the exhauster 40, and the heater 50 so as to perform an oxidation step S20.

Specifically, first, the controller 80 controls the exhauster 40 to decompress the inside of the processing container 10 to a predetermined pressure and controls the heater 50 to adjust and maintain the temperature of the substrate W to the first temperature T1. Then, the controller 80 controls the gas supply 30 to supply hydrogen gas and oxygen gas into the processing container 10. As a result, the surface layer of the target film 102 is oxidized to form an oxide film 103.

Subsequently, the controller 80 controls the gas supply 30, the exhauster 40 and the heater 50 so as to perform an etching step S30. Specifically, first, the controller 80 controls the exhauster 40 to decompress the inside of the processing container 10 to a predetermined pressure and controls the heater 50 to adjust and maintain the temperature of the substrate W to the second temperature T2. Then, the controller 80 controls the gas supply 30 to supply hydrogen fluoride gas and ammonia gas into the processing container 10. Accordingly, the hydrogen fluoride gas and ammonia gas react with the oxide film 103 to form ammonium silicofluoride [$(NH_4)_2SiF_6$]. Then, the controller 80 controls the heater 50 to heat the temperature of the substrate W to a third temperature T3, to sublimate the ammonium silicofluoride. This allows the target film 102 to remain and the oxide film 103 to be selectively etched and removed. Therefore, the amount of etching of the target film 102 can be controlled by adjusting the thickness of the oxide film 103 formed on the surface layer of the target film 102 in the oxidation step S20.

Subsequently, the controller 80 boosts the inside of the processing container 10 to atmospheric pressure, and lowers the temperature inside of the processing container 10 to a carry out temperature, and subsequently controls the elevating mechanism 25 to carry out the boat 16 from the processing container 10.

EXAMPLE

The following describes an example in which it was confirmed that the etching amount of the target film 102 can be controlled by the substrate processing method according to the embodiment.

In the example, the substrate having the SiCN film on the surface was prepared, the prepared substrate was housed in the processing container 10 of the substrate processing apparatus 1 described above, and the SiCN film was etched under the following conditions 1 to 6. The etching amount of the SiCN film was calculated by measuring the film thickness before and after the etching of the SiCN film with a spectroscopic ellipsometer and obtaining the difference between the film thickness before and after the etching. The SiCN film is an example of the target film 102.

(Condition 1)

In condition 1, the etching step S30 was performed on the prepared substrate without performing the oxidation step S20. In the etching step S30, a temperature lowering step S31, a COR step S32, a temperature raising step S33, and a PHT step S34 were performed in the stated order. In the COR step S32, the substrate was heated for 5 minutes while maintaining the temperature of the substrate at 75 degrees Celsius.

(Condition 2)

In condition 2, the time of the COR step S32 was changed to 10 minutes from condition 1. The other conditions were the same as in condition 1.

(Condition 3)

In condition 3, the oxidation step S20 and the etching step S30 were performed on the prepared substrate in the stated order. In the oxidation step S20, the time for supplying hydrogen gas and oxygen gas into the processing container 10 was set at 10 minutes. The conditions of the etching step S30 were the same as those of the etching step S30 under condition 1.

(Condition 4)

In condition 4, the time of the COR step S32 was changed to 10 minutes from condition 3. The other conditions were the same as in condition 3.

(Condition 5)

In condition 5, the time of the oxidation step S20 was changed to 30 minutes from condition 3. The other conditions were the same as in condition 3.

(Condition 6)

In condition 6, the time of the COR step S32 was changed to 10 minutes from condition 5. The other conditions were the same as in condition 5.

For comparison, a substrate with a SiN film on the surface was prepared, the prepared substrate was housed in the processing container 10 of the substrate treatment apparatus 1 described above, and the SiN film was etched under conditions 7 and 8 described below. The etching amount of the SiN film was calculated by measuring the film thickness before and after the etching the SiN film with a spectroscopic ellipsometer and obtaining the difference between the film thickness before and after the etching.

(Condition 7)

Condition 7 is the same condition as condition 1.

(Condition 8)

Condition 8 is the same condition as Condition 2.

For comparison, a substrate with a SiO$_2$ film on the surface was prepared, the prepared substrate was housed in the processing container 10 of the substrate treatment apparatus 1 described above, and the SiO$_2$ film was etched according to conditions 9 and 10 described below. The amount of etching of the SiO$_2$ film was calculated by measuring the film thickness before and after the etching of the SiO$_2$ film with a spectroscopic ellipsometer and obtaining the difference between the film thickness before and after the etching.

(Condition 9)

Condition 9 is the same condition as condition 1.

(Condition 10)

Condition 10 is the same condition as condition 2.

Figure 5:
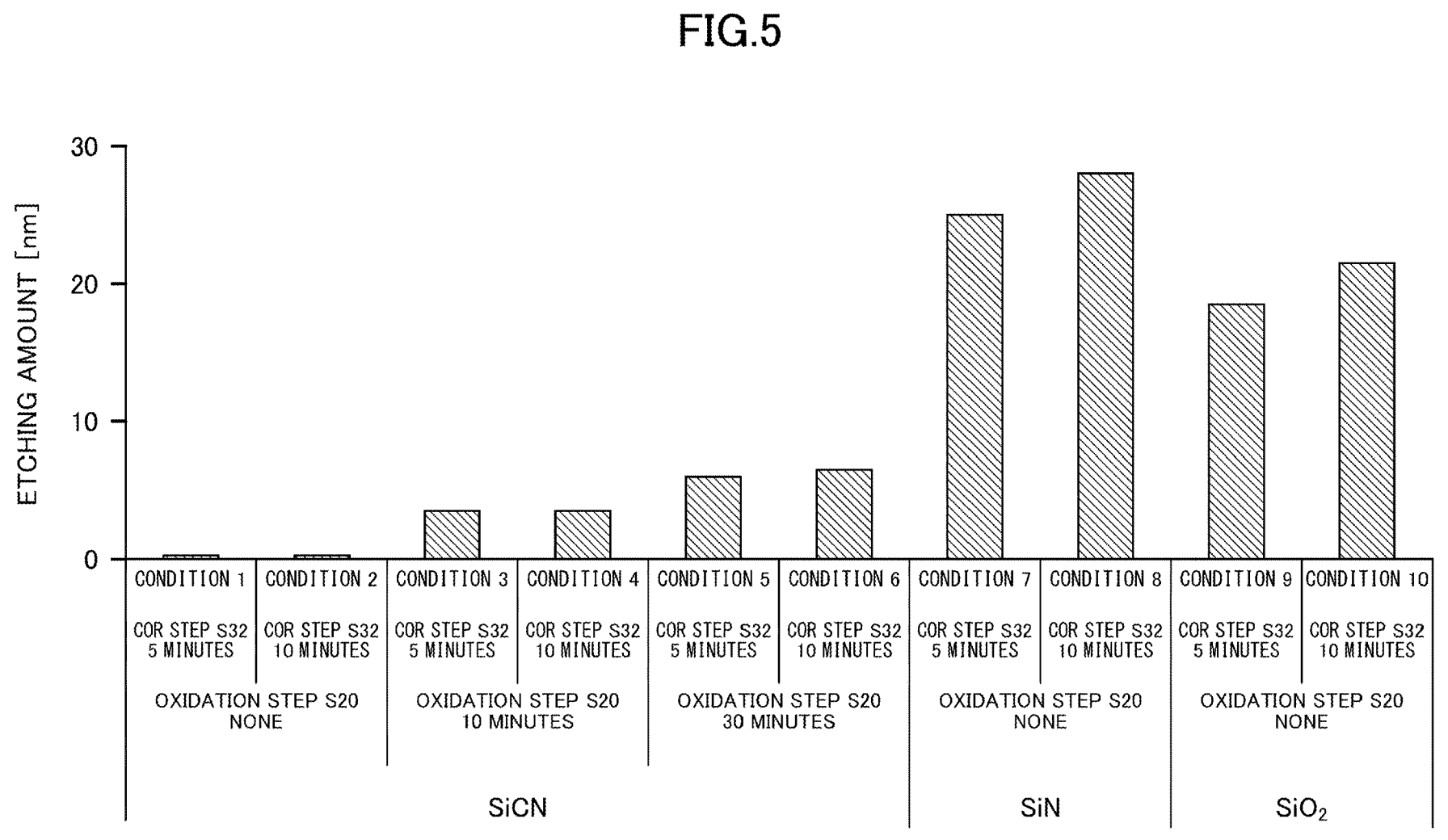

FIG. 5 illustrates the result of evaluating the etching amount. FIG. 5 illustrates the etching amount [nm] of the SiCN film etched under conditions 1 to 6, the etching amount [nm] of the SiN film etched under conditions 7 and 8, and the etching amount [nm] of the SiO$_2$ film etched under conditions 9 and 10.

As illustrated in FIG. 5, while the etching amount is approximately 0 nm under conditions 1 and 2, the etching amount ranges from 2 nm to 6 nm under conditions 3 to 6. These results indicate that the SiCN film is hardly etched when the oxidation step S20 is not performed, but can be etched by performing the oxidation step S20.

As illustrated in FIG. 5, it can be seen that the etching amount is in the range of 2 nm to 3 nm in both conditions 3 and 4, and in the range of 5 nm to 6 nm in both conditions 5 and 6. These results indicate that the etching amount of the SiCN film depends on the time of the oxidation step S20 and does not depend on the time of the COR step S32. That is, the etching amount of the SiCN film can be controlled by changing the time of the oxidation step S20. Specifically, the etching amount of the SiCN film can be increased by lengthening the time of the oxidation step S20.

As illustrated in FIG. 5, it can be seen that the etching amount is in the range of 15 nm to 30 nm under the conditions 7 to 10. These results indicate that SiN and SiO$_2$ films, unlike SiCN films, can be etched by performing the etching step S30 without performing the oxidation step S20.

According to one embodiment of the present invention, it is possible to control the amount of etching of the target film.

The disclosed embodiment is to be considered illustrative in all respects and not restrictive. The above embodiment may be omitted, replaced, or modified in various forms without departing from the scope and purport of the attached claims.

The above embodiment describes the case where the substrate processing apparatus is a batch-type apparatus that processes multiple substrates at once, but the present disclosure is not limited to this. For example, the substrate processing apparatus may be a single-sheet apparatus that processes one substrate at a time.

The invention claimed is:

1. A substrate processing method comprising:

preparing a substrate having a target film including silicon, carbon, and nitrogen on a surface of the substrate;

supplying hydrogen gas and oxygen gas to the target film to oxidize a surface layer of the target film and form an oxide film; and etching the oxide film, wherein the etching includes supplying a gas including a fluorine-containing gas and a basic gas to the target film to convert at least a part of the target film into a reaction product; and heating the substrate to sublimate the reaction product.

2. The substrate processing method according to claim 1, wherein the fluorine-containing gas is a hydrogen fluoride gas; and the basic gas is an ammonia gas.

3. A substrate processing method comprising:

preparing a substrate having a target film including silicon, carbon, and nitrogen on a surface of the substrate;

supplying hydrogen gas and oxygen gas to the target film to oxidize a surface layer of the target film and form an oxide film; and etching the oxide film, wherein the oxide film is formed and etched in a same processing
container.

4. The substrate processing method according to claim 3, wherein the processing container houses a plurality of the substrates in a shape of a shelf.

5. The substrate processing method according to claim 1, wherein the target film further includes an element different from silicon, carbon, and nitrogen.

6. The substrate processing method according to claim 5, wherein the element is oxygen, boron, or a combination of oxygen and boron.

7. The substrate processing method according to claim 1, wherein the target film is a SiCN film.

\* \* \* \* \*